(12) United States Patent
Hamada et al.

(10) Patent No.: US 8,512,881 B2
(45) Date of Patent: Aug. 20, 2013

(54) ORGANIC MATERIAL AND ORGANIC LIGHT EMITTING DEVICE INCLUDING THE SAME

(75) Inventors: Yuji Hamada, Yongin (KR); Kwan-Hee Lee, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 303 days.

(21) Appl. No.: 12/912,628

(22) Filed: Oct. 26, 2010

(65) Prior Publication Data
US 2012/0007495 A1    Jan. 12, 2012

(30) Foreign Application Priority Data
Jul. 7, 2010    (KR) .................. 10-2010-0065452

(51) Int. Cl.
*H01L 51/54*    (2006.01)
(52) U.S. Cl.
USPC ........... 428/690; 428/917; 313/504; 313/506; 252/301.16; 252/301.24; 257/40; 257/103; 257/E51.041; 548/150
(58) Field of Classification Search
None
See application file for complete search history.

(56) References Cited

U.S. PATENT DOCUMENTS
5,779,937 A * 7/1998 Sano et al. ............... 252/301.16

FOREIGN PATENT DOCUMENTS
| EP | 1323808 A2 | 7/2003 |
| EP | 2034001 A2 | 3/2009 |
| EP | 2103665 A1 * | 9/2009 |
| JP | 08-315983 B2 | 11/1996 |
| JP | 09-279136 B2 | 10/1997 |
| JP | 09-328678 | 12/1997 |
| JP | 2000-100569 A | 4/2000 |
| JP | 2007-207916 A | 8/2007 |

OTHER PUBLICATIONS

Extended European Search Report issued by the European Patent Office dates Nov. 16, 2012, 4 pages.

* cited by examiner

*Primary Examiner* — Michael H Wilson
(74) *Attorney, Agent, or Firm* — Knobbe Martens Olson & Bear LLP

(57) ABSTRACT

Disclosed are an organic material including a compound represented by the following Chemical Formula 1, and an organic light emitting device including the organic material.

CHEMICAL FORMULA 1

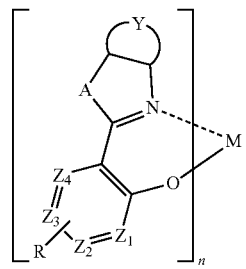

In Chemical Formula 1, A is an oxygen (O) atom or a sulfur (S) atom, M is a divalent or trivalent metal atom, $R_1$ is an organic group, Y is a substituted or unsubstituted condensed polycyclic aromatic group, $Z_1$ to $Z_4$ are independently a carbon atom or a nitrogen atom, m is an integer ranging from 1 to 4, and n is 2 or 3.

8 Claims, 2 Drawing Sheets

ORGANIC MATERIAL AND ORGANIC LIGHT EMITTING DEVICE INCLUDING THE SAME

CROSS-REFERENCE TO RELATED APPLICATIONS

This application claims priority to and the benefit of Korean Patent Application No. 10-2010-0065452 filed in the Korean Intellectual Property Office on Jul. 7, 2010, the entire contents of which are incorporated herein by reference.

BACKGROUND

1. Field

This disclosure relates to an organic material for an organic light emitting device, and an organic light emitting device.

2. Description of the Related Art

An organic light emitting device includes two electrodes facing each other and an organic layer interposed between the two electrodes. An organic light emitting device emits light when holes injected from one electrode are combined with electrons injected from the other electrode in an organic layer to produce excitons, and energy is released from the excitons. An organic light emitting device may be applied to various fields including display devices and illuminators.

In an organic light emitting device, electric characteristics of a material in an organic layer may have a large effect on electrical characteristics of an organic light emitting device.

SUMMARY

One aspect of this disclosure provides an organic material having improved carrier transport capability.

Another aspect of this disclosure provides an organic light emitting diode device including the organic material.

According to one embodiment, an organic material including a compound represented by the following Chemical Formula 1 is provided.

CHEMICAL FORMULA 1

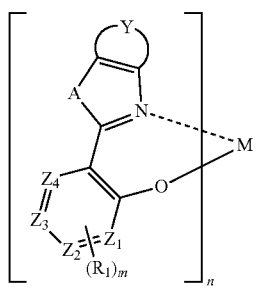

In Chemical Formula 1, A is an oxygen (O) atom or a sulfur (S) atom, M is a divalent or trivalent metal atom, R1 is selected from the group consisting of hydrogen, a halogen (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a $C_1$ to $C_{30}$ alkyl group, a $C_2$ to $C_{16}$ alkenyl group, a $C_2$ to $C_{16}$ alkynyl group, a $C_6$ to $C_{30}$ aryl group, a $C_7$ to $C_{13}$ arylalkyl group, a $C_1$ to $C_4$ oxyalkyl group, a $C_1$ to $C_{20}$ heteroalkyl group, a $C_3$ to $C_{20}$ heteroarylalkyl group, a cycloalkyl group, a $C_3$ to $C_{15}$ cycloalkenyl group, a $C_6$ to $C_{15}$ cycloalkynyl group, and a heterocycloalkyl group, Y is a substituted or unsubstituted condensed polycyclic aromatic group, Z1 to Z4 are independently a carbon atom or a nitrogen atom, m is an integer ranging from 1 to 4, and n is 2 or 3.

According to another embodiment, an organic light emitting device is provided that includes a first electrode and a second electrode facing each other, and an organic layer interposed between the first electrode and the second electrode. The organic layer includes a compound represented by the above Chemical Formula 1.

The m is an integer of 2 or more, and R1's being adjacent to each other may form a condensed ring.

The condensed polycyclic aromatic group may be a hydrocarbon-based condensed polycyclic aromatic group or a hetero condensed polycyclic aromatic group including a carbon atom, a nitrogen atom, an oxygen atom, a sulfur atom, a phosphorus atom, or a combination thereof.

The Y may be represented by at least one of the following Chemical Formulae 2 to 12.

CHEMICAL FORMULA 2

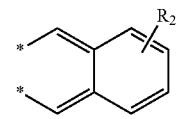

CHEMICAL FORMULA 3

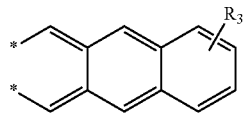

CHEMICAL FORMULA 4

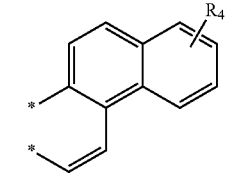

CHEMICAL FORMULA 5

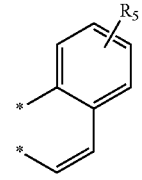

CHEMICAL FORMULA 6

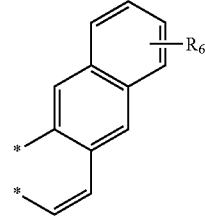

CHEMICAL FORMULA 7

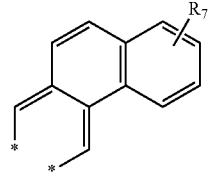

CHEMICAL FORMULA 8

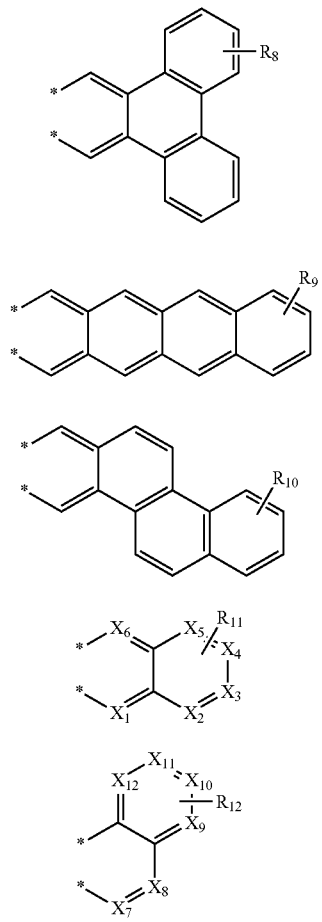

CHEMICAL FORMULA 9

CHEMICAL FORMULA 10

CHEMICAL FORMULA 11

CHEMICAL FORMULA 12

In Chemical Formulae 2 to 12, $R_2$ to $R_{12}$ are independently selected from the group consisting of hydrogen, a $C_1$ to $C_{10}$ alkyl group, an amine group, a $C_1$ to $C_{10}$ alkylamine group, a $C_1$ to $C_{10}$ an alkoxy group, a $C_2$ to $C_{10}$ ester group, a nitro group, a cyano group, a $C_6$ to $C_{30}$ aryl group, a $C_3$ to $C_{20}$ heteroaryl group, a pyridyl group, and a halogen; and in Chemical Formulae 11 and 12, $X_1$ to $X_{12}$ are selected from the group consisting of a carbon atom, a nitrogen atom, an oxygen atom, a sulfur atom, and a phosphorus atom.

The compound represented by the above Chemical Formula 1 may include at least one selected from the compounds represented by the following Chemical Formulae 13 to 25.

CHEMICAL FORMULA 13

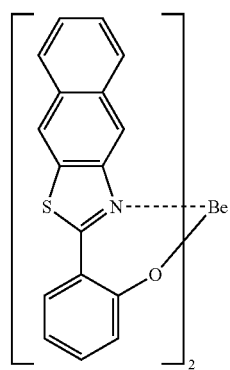

CHEMICAL FORMULA 14

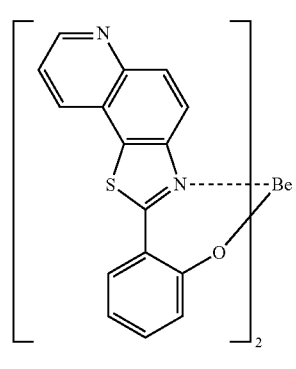

CHEMICAL FORMULA 15

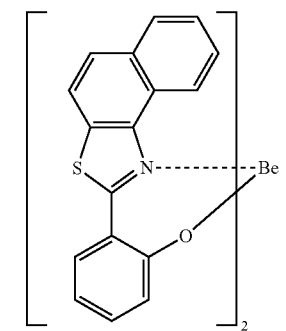

CHEMICAL FORMULA 16

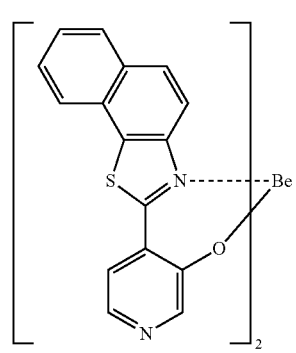

CHEMICAL FORMULA 17

CHEMICAL FORMULA 18
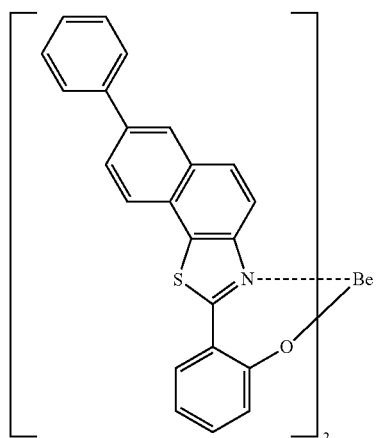
CHEMICAL FORMULA 19
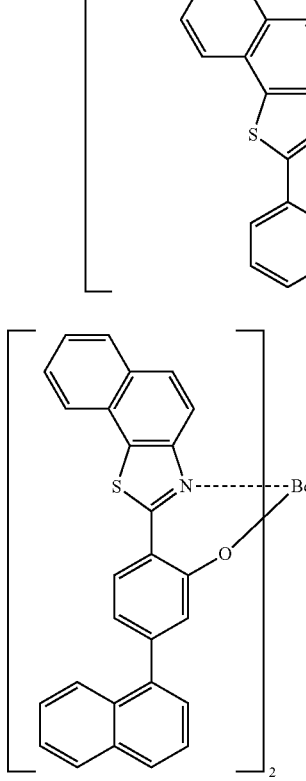
CHEMICAL FORMULA 20
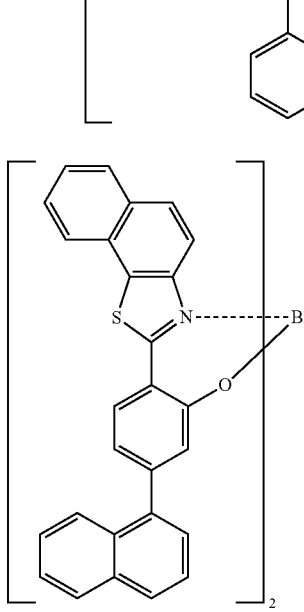
CHEMICAL FORMULA 21
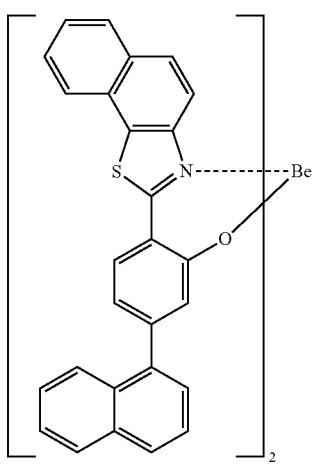
CHEMICAL FORMULA 22
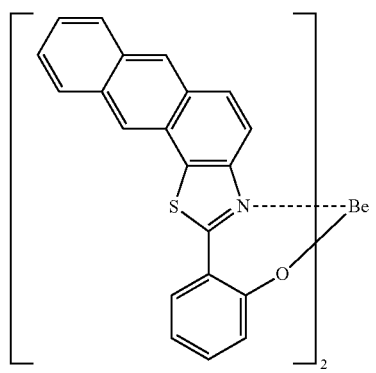
CHEMICAL FORMULA 23
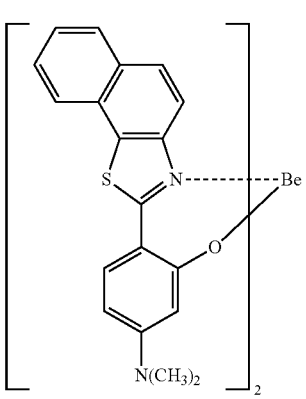
CHEMICAL FORMULA 24
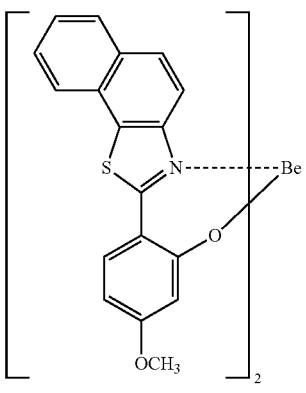
CHEMICAL FORMULA 25
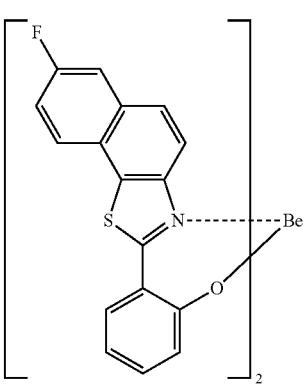
The organic layer may further include at least one of the compounds represented by the following Chemical Formulae 13 to 25.

CHEMICAL FORMULA 13
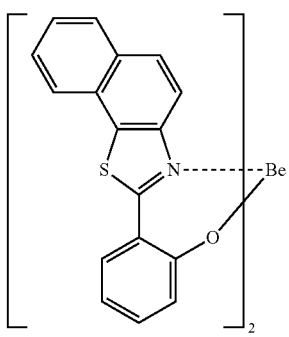
CHEMICAL FORMULA 14
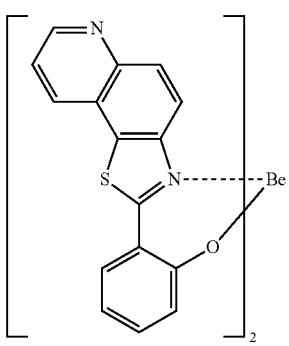
CHEMICAL FORMULA 15
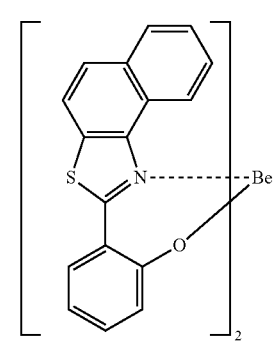
CHEMICAL FORMULA 16
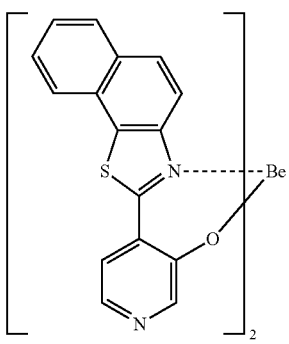
-continued
CHEMICAL FORMULA 17
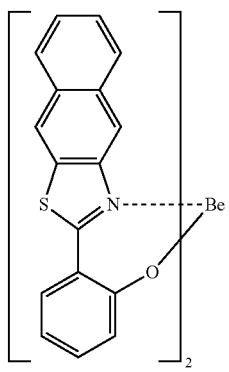
CHEMICAL FORMULA 18
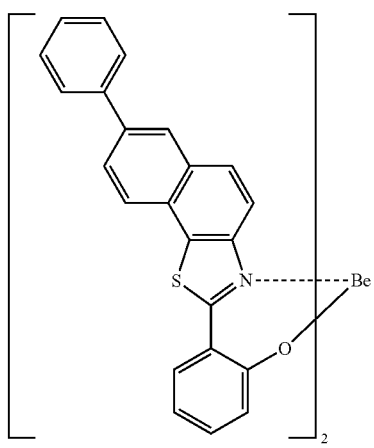
CHEMICAL FORMULA 19
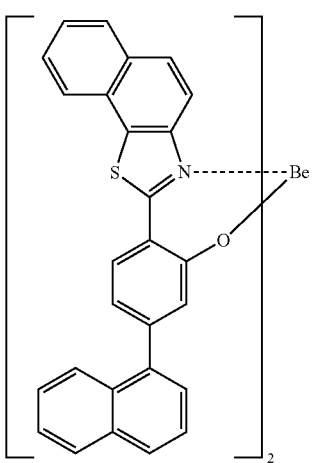

CHEMICAL FORMULA 20

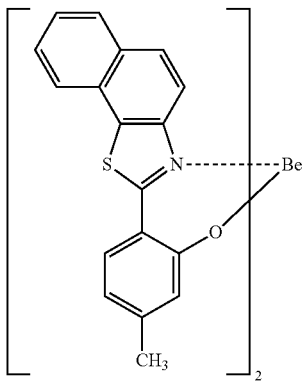

CHEMICAL FORMULA 21

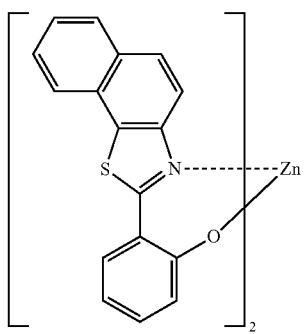

CHEMICAL FORMULA 22

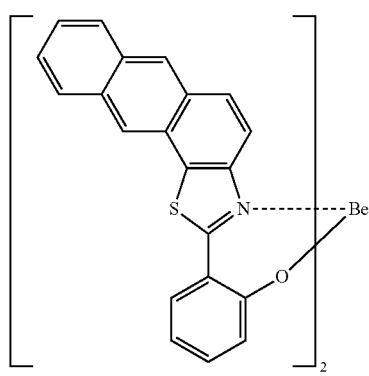

CHEMICAL FORMULA 23

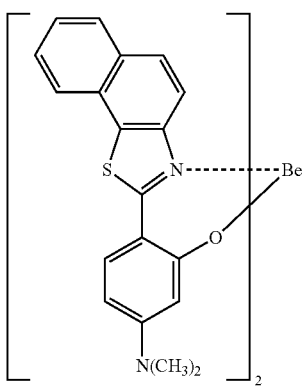

CHEMICAL FORMULA 24

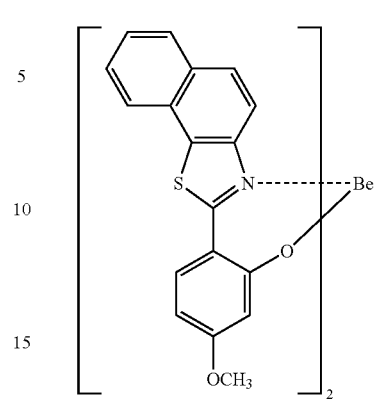

CHEMICAL FORMULA 25

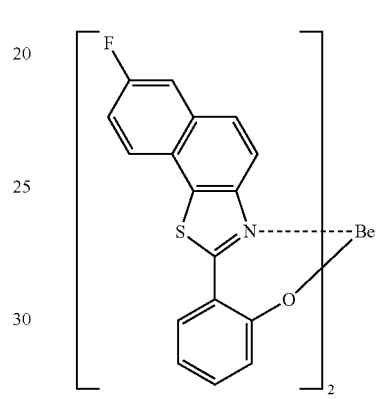

The organic layer may be an organic emission layer, and the compound represented by the above Chemical Formula 1 may be a host material.

The organic emission layer may further include a dopant material.

An organic material having improved electrical characteristics is provided. The organic material may implement an organic light emitting device having improved luminous efficiency and driving voltage characteristics.

DETAILED DESCRIPTION

Figure 1:
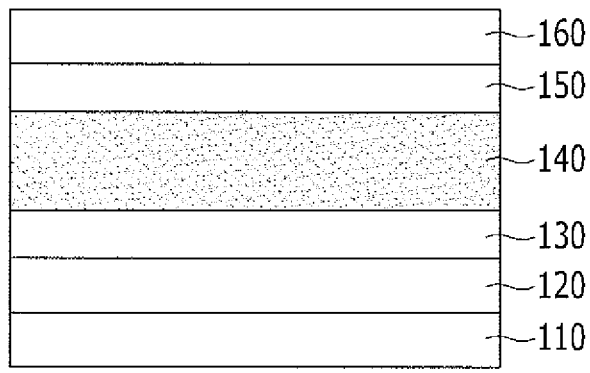
FIG. 1 is a view showing an organic light emitting device according to one embodiment.

Hereinafter, organic materials and organic light emitting devices including the same are described. The following embodiments are provided so that a person of an ordinary skill in the art may understand this disclosure, which is not limited thereto. As those skilled in the art would realize, the described embodiments may be modified in various different ways, all without departing from the spirit or scope of this disclosure.

As used herein, when a definition is not otherwise provided, the term "substituted" refers to one substituted with a halogen (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, an alkyl group, a $C_2$ to $C_{16}$ alkenyl group, a $C_2$ to $C_{16}$ alkynyl group, a $C_6$ to $C_{30}$ aryl group, a $C_7$ to $C_{13}$ arylalkyl group, a $C_1$ to $C_4$ oxyalkyl group, a $C_1$ to $C_{20}$ heteroalkyl group, a $C_3$ to $C_{20}$ heteroarylalkyl group, a cycloalkyl group, a $C_3$ to $C_{15}$ cycloalkenyl group, a $C_6$ to $C_{15}$ cycloalkynyl group, a heterocycloalkyl group, and a combination thereof instead of hydrogen.

As used herein, when a definition is not otherwise provided, the term "hetero" refers to one including 1 to 3 heteroatoms selected from the group consisting of N, O, S, and P.

In this specification, the term "and/or" refers to at least one of listed constituent elements. In this specification, constituent elements and/or portions are depicted using the words "first", "second", and the like, which are used for definite description.

In this specification, it will be understood that when one constituent element is referred to as being "on" another constituent element, it can be directly on the other element or intervening elements may also be present.

In the drawings, the thicknesses of constituent elements are exaggerated for clarity. The terms indicating positions such as "upper" and "under" are used for definite description of relative positions, and do not indicate absolute positions of constituent elements.

Hereinafter, an organic material according to one embodiment is described.

The organic material may be applied to an organic emission layer, an auxiliary layer, or a combination thereof for an organic light emitting device. The auxiliary layer may include one of a hole injection layer (HIL), a hole transport layer, an electron injection layer (EIL), and an electron transport layer.

The organic material includes a compound represented by Chemical Formula 1.

CHEMICAL FORMULA 1

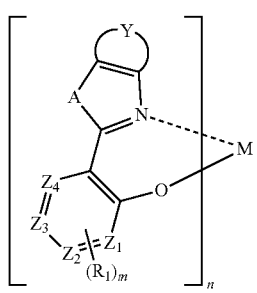

In Chemical Formula 1, A is an oxygen atom or a sulfur atom, M is a divalent or trivalent metal, R1 is selected from the group consisting of hydrogen, a halogen (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a $C_1$ to $C_{30}$ alkyl group, a $C_2$ to $C_{16}$ alkenyl group, a $C_2$ to $C_{16}$ alkynyl group, a $C_6$ to $C_{30}$ aryl group, a $C_7$ to $C_{13}$ arylalkyl group, a $C_1$ to $C_4$ oxyalkyl group, a $C_1$ to $C_{20}$ heteroalkyl group, a $C_3$ to $C_{20}$ heteroarylalkyl group, a cycloalkyl group, a $C_3$ to $C_{15}$ cycloalkenyl group, a $C_6$ to $C_{15}$ cycloalkynyl group, and a heterocycloalkyl group, and m is an integer ranging from 1 to 4. One embodiment, m is an integer of 2 or more, and R1's being adjacent to each other may form a condensed ring.

In Chemical Formula 1, Y is a substituted or unsubstituted $C_3$ to $C_{30}$ condensed polycyclic aromatic group (fused polycyclic aromatic group). The condensed polycyclic aromatic group may be a hydrocarbon-based condensed polycyclic aromatic group or a hetero condensed polycyclic aromatic group including a carbon atom, a nitrogen atom, an oxygen atom, a sulfur atom, a phosphorus atom, or a combination thereof. The hetero atom may be a nitrogen atom, an oxygen atom, a sulfur atom, a phosphorus atom, or a combination thereof.

In Chemical Formula 1, Z1 to Z4 are independently a carbon atom or a nitrogen atom, and n is 2 or 3.

The Y may have a substantially planar structure. The Y may be positioned in the same plane as a hetero cycle including the A and the nitrogen atom (N) of the above Chemical Formula 1. For example, the Y may be selected from substituents represented by the following Chemical Formulae 2 to 12.

CHEMICAL FORMULA 2

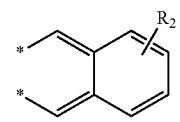

CHEMICAL FORMULA 3

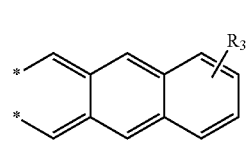

CHEMICAL FORMULA 4

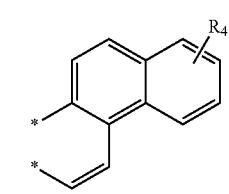

CHEMICAL FORMULA 5

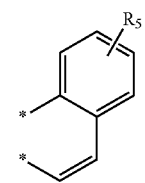

CHEMICAL FORMULA 6

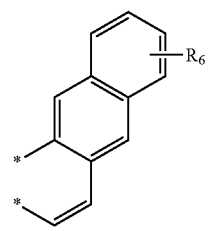

CHEMICAL FORMULA 7

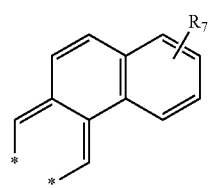

CHEMICAL FORMULA 8

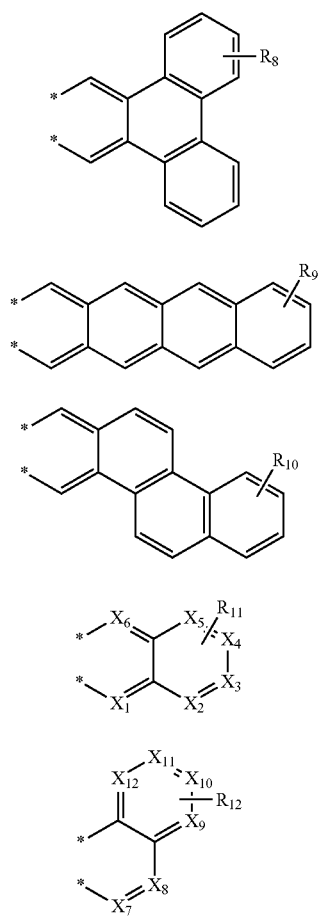

CHEMICAL FORMULA 9

CHEMICAL FORMULA 10

CHEMICAL FORMULA 11

CHEMICAL FORMULA 12

CHEMICAL FORMULA 14

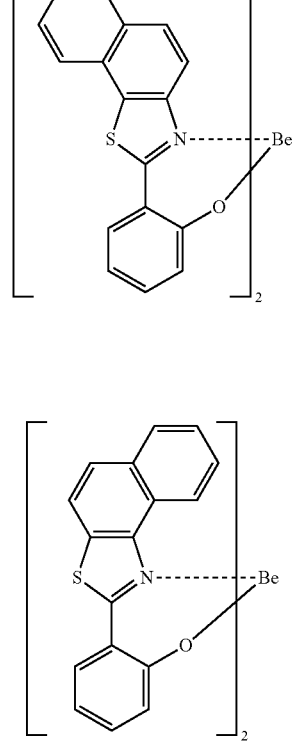

CHEMICAL FORMULA 15

In Chemical Formulae 2 to 12, $R_2$ to $R_{12}$ are independently selected from the group consisting of hydrogen, a $C_1$ to $C_{10}$ alkyl group, an amine group, a $C_1$ to $C_{10}$ alkylamine group, a $C_1$ to $C_{10}$ alkoxy group, a $C_2$ to $C_{10}$ an ester group, a nitro group, a cyano group, a $C_6$ to $C_{30}$ aryl group, a $C_3$ to $C_{20}$ heteroaryl group, a pyridyl group, and a halogen, and in Chemical Formulae 11 and 12, $X_1$ to $X_{12}$ are selected from the group consisting of a carbon atom, a nitrogen atom, an oxygen atom, a sulfur atom, and a phosphorus atom.

For example, the organic material may include at least one of compounds represented by the following Chemical Formulae 13 to 25.

CHEMICAL FORMULA 16

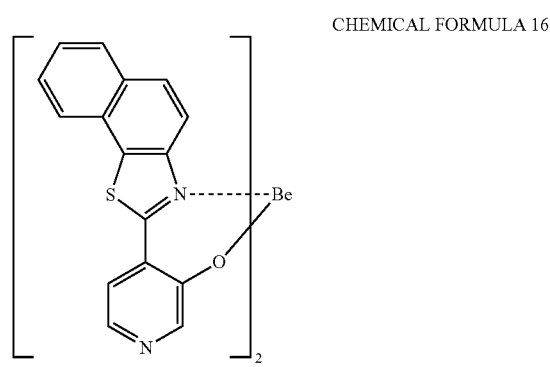

CHEMICAL FORMULA 13

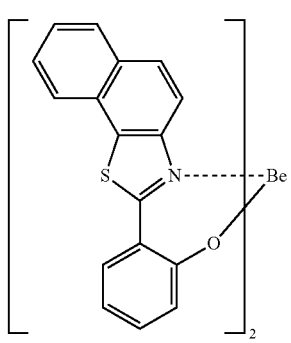

CHEMICAL FORMULA 17

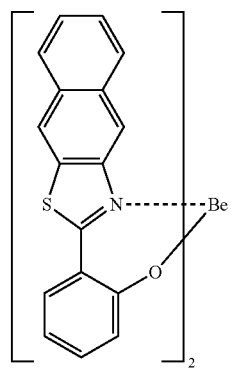

-continued

CHEMICAL FORMULA 18

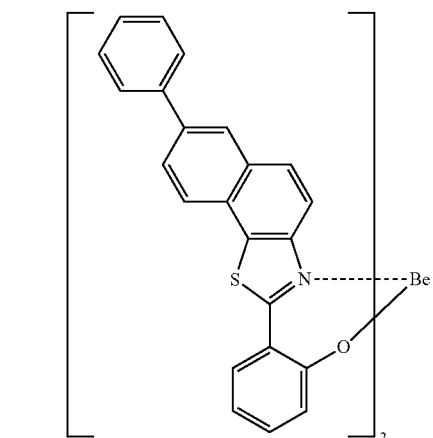

CHEMICAL FORMULA 19

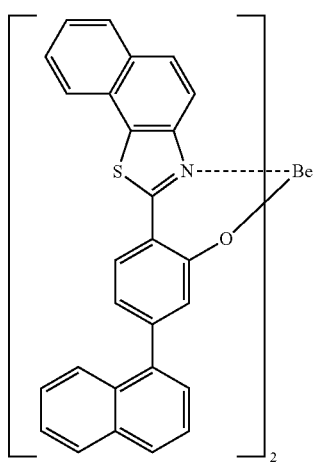

CHEMICAL FORMULA 20

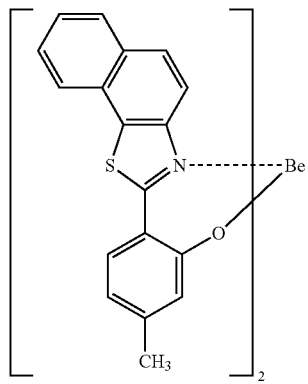

CHEMICAL FORMULA 21

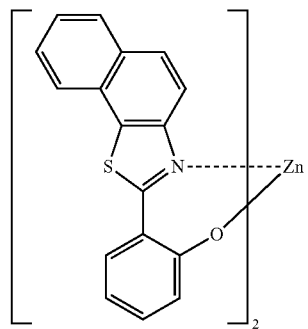

CHEMICAL FORMULA 22

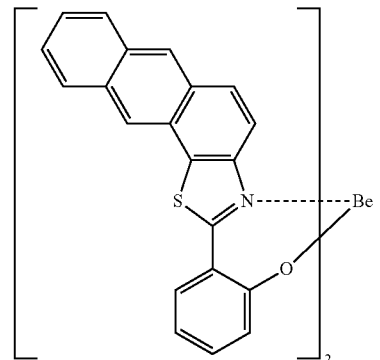

CHEMICAL FORMULA 23

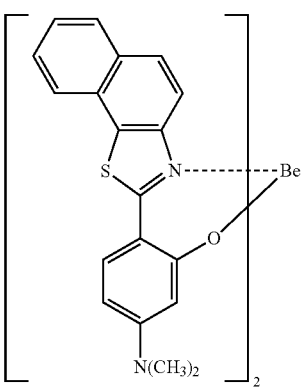

CHEMICAL FORMULA 24

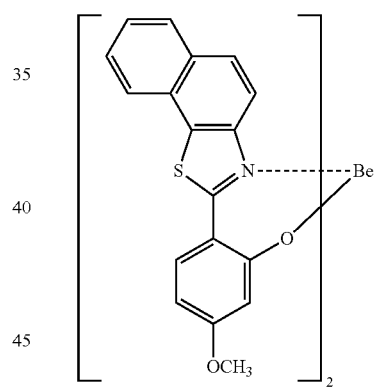

CHEMICAL FORMULA 25

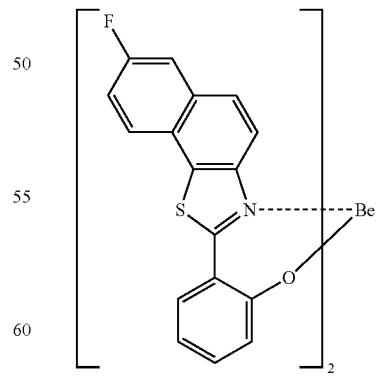

Pi-electron systems of hetero cycle including the A and nitrogen (N) may be extended to an aromatic group of the Y. Accordingly, an organic material including the compound may have improved electrical characteristics.

Referring to FIG. 1, an organic light emitting device including the organic material is described.

FIG. 1 is a cross-sectional view showing an organic light emitting device according to one embodiment.

Referring to FIG. 1, the organic light emitting device includes a lower electrode 120, an upper electrode 160, and an organic emission layer 140 disposed between the lower electrode 120 and upper electrode 160. A lower auxiliary layer 130 may be interposed between the lower electrode 120 and the organic emission layer 140. An upper auxiliary layer 150 may be interposed between the organic emission layer 140 and the upper electrode 160.

The substrate 110 may include glass, a polymer, or a combination thereof.

At least one of the lower electrode 120 and the upper electrode 160 may be a cathode and the other one may be an anode. The lower electrode 120 and the upper electrode 160 may be a transparent or opaque electrode. For example, the lower electrode 120 and the upper electrode 160 may include ITO, IZO, or a combination thereof, or aluminum (Al), silver (Ag), or a combination thereof.

At least one of the lower auxiliary layer 130 and the upper auxiliary layer 150 may include a hole injection layer (HIL) and/or a hole transport layer (HTL), and the other one may include an electron transport layer (ETL) and/or an electron injection layer (EIL). For example, when the lower electrode 120 is an anode and the upper electrode 150 is a cathode, the lower auxiliary layer 130 may include a hole injection layer (HIL) and/or a hole transport layer (HTL) and the upper auxiliary layer 150 may include an electron injection layer (EIL) and/or an electron transport layer (ETL). However, at least one of the lower auxiliary layer 130 and the upper auxiliary layer 150 may be omitted.

At least one of the lower auxiliary layer 130, the organic emission layer 140, and the upper auxiliary layer 150 may include the organic material according to one embodiment. For example, an organic material according to one embodiment may be included as a host material in the organic emission layer 140.

The organic material may improve electrical characteristics and luminous efficiency characteristics of organic light emitting devices.

The compound represented by the above Chemical Formula 1 may have extended pi-electron systems by the aromatic groups of Y. The extended pi-electron systems may improve carrier transport capability of the compound. Accordingly, the organic light emitting device including the compound represented by the above Chemical Formula 1 shows reduced driving electric power and improved luminous efficiency.

When the organic material is included in the organic emission layer 140, the organic material may further include a dopant material. The organic material may further include a red dopant material, a green dopant material, a blue dopant material, or a combination thereof.

Examples of the dopant material may include tris(1-phenylisoquinoline)iridium (Ir(piq)3), bis(2-phenylpyridine)iridium (ppy), bis(1-(phenyl)isoquinoline)iridium(III)acetylanetonate (Ir(phq)2acac), platinum(II)octaethylporphine (PtOEP), fac-tris(2-phenylpyridine)iridium (Ir(ppy)3), tris(2-(1-cyclohexenyl)pyridine)iridium (Ir(chpy)3), tris(2-(3-methyl-1-cyclohexenyl)pyridine)iridium (Ir(mchpy)3), iridium(III)bis(4,6-difluorophenyl)pyridinato-N,C-2'picolinate (FIrpic), iridium(III)bis(4',6'-difluorophenylpyridinato)tetrakis(1-pyrazoyl)borate (Fir6), or a combination thereof.

Figure 2:
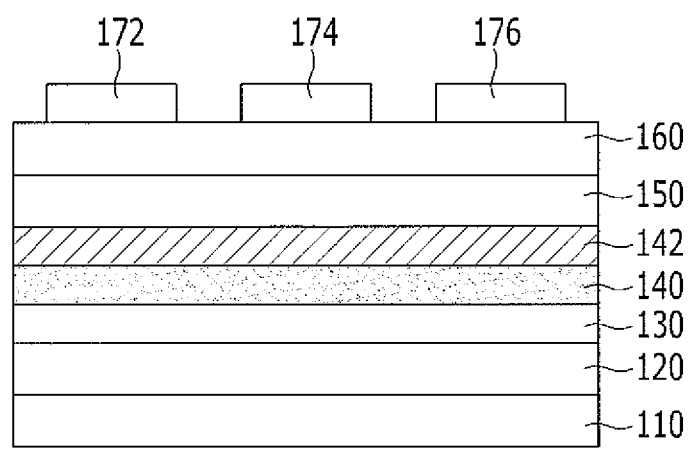
FIG. 2 is a view showing an organic light emitting device according to another embodiment.

Referring to FIG. 2, another organic light emitting device including the organic material is described. Substantially equivalent constituent elements to constituent elements in FIG. 1 are assigned the same reference numerals, which is not described hereinafter.

FIG. 2 is a cross-sectional view of an organic light emitting device according to another embodiment.

Referring to FIG. 2, organic emission layers 140 and 142 may include a plurality of laminated layers. The layers may emit different light from each other, and the laminated layers are combined with each other to emit white light. At least one of the organic emission layers 140 and 142 may include the organic material according to one embodiment.

The upper electrode 160 is disposed on the upper emission layer 140, and color filters 172, 174, and 176 are disposed on the upper electrode 160. White light emitted from the organic emission layers 140 and 142 may be converted into red, blue, and green colors after passing through the color filters 172, 174, and 176. On the contrary, color filters having different colors may be disposed and different colors may be emitted.

The following examples illustrate this disclosure in more detail. These examples, however, are not in any sense to be interpreted as limiting the scope of this disclosure.

Organic Light Emitting Device Fabrication 1

An Organic Light Emitting Device Including a Red Emission Layer

Example 1

A Ag/ITO layer was disposed on a glass substrate and then patterned, preparing a lower electrode. Next, N4,N4'-diphenyl-N4,N4'-bis(9-phenyl-9H-carbazol-3-yl)biphenyl-4,4'-diamine and dipyrazino2,3-f:2',3'-hquinoxaline hexacarbonitrile (HAT-CN) were disposed to be respectively 70 and 5 nm thick as a hole injection layer (HIL) on the lower electrode. Then, N,N'-di(1-naphtyl)-N,N'-diphenyl-1,1'-biphenyl-4,4'-diamine (NPD) was disposed to be 100 nm thick as a hole transport layer (HTL) thereon.

Then, a mixture of a compound represented by the following Chemical Formula 13 and tris(1-phenylisoquinoline)iridium (Ir(piq)3) was deposited to foam an organic emission layer. The Ir(piq)3 was mixed in a concentration of 3 wt % with the compound represented by Chemical Formula 13. The compound represented by the above Chemical Formula 13 was used as a host material for an organic emission layer. The Ir(piq)3 was used as a dopant for an organic emission layer.

CHEMICAL FORMULA 13

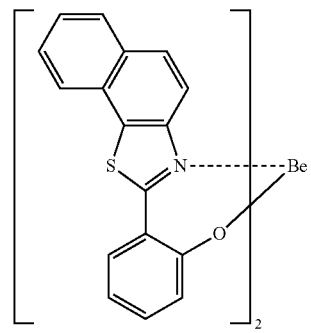

On the organic emission layer, 2-(4-(9,10-di(naphthalen-2-yl)anthracen-2-yl)phenyl)-1-phenyl-1H-benzodimidazole) (ETL1) and 8-hydroxyquinolinolato lithium (Liq) were deposited to be respectively 30 and 0.5 nm thick to dispose an electron transport layer (ETL) and an electron injection layer (EIL).

Next, a Mg/Ag layer (a weight ratio of Mg:Ag=160:10) was deposited to be 200 nm thick, fabricating an upper electrode.

In this way, an organic light emitting device including a red emission layer was fabricated.

Example 2

An organic light emitting device including a red emission layer was fabricated according to the same method as Example 1, except for using a compound represented by the following Chemical Formula 14 as a host material.

CHEMICAL FORMULA 14

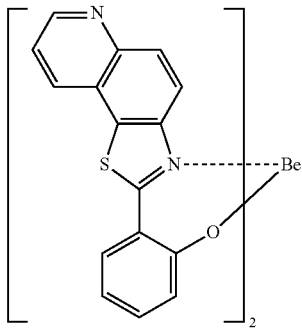

Example 3

An organic light emitting device including a red emission layer was fabricated according to the same method as Example 1, except for using a compound represented by the following Chemical Formula 16 as a host material.

CHEMICAL FORMULA 16

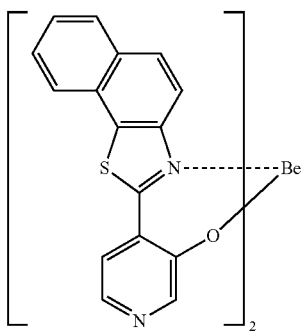

Example 4

An organic light emitting device including a red emission layer was fabricated according to the same method as Example 1, except for using a compound represented by the following Chemical Formula 17 as a host material.

CHEMICAL FORMULA 17

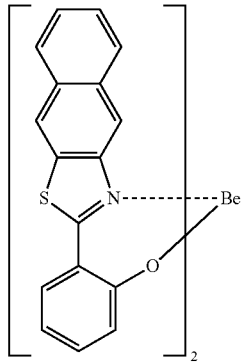

Example 5

An organic light emitting device including a red emission layer was fabricated according to the same method as Example 1, except for using a compound represented by the following Chemical Formula 18 as a host material.

CHEMICAL FORMULA 18

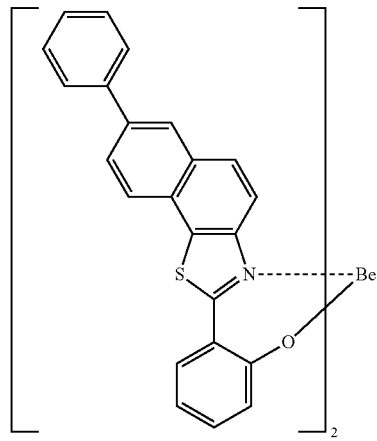

Example 6

An organic light emitting device including a red emission layer was fabricated according to the same method as Example 1, except for using a compound represented by the following Chemical Formula 19 as a host material.

CHEMICAL FORMULA 19

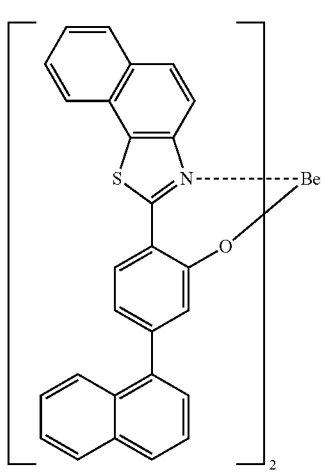

Example 7

An organic light emitting device including a red emission layer was fabricated according to the same method as Example 1, except for using a compound represented by the following Chemical Formula 20 as a host material.

CHEMICAL FORMULA 20

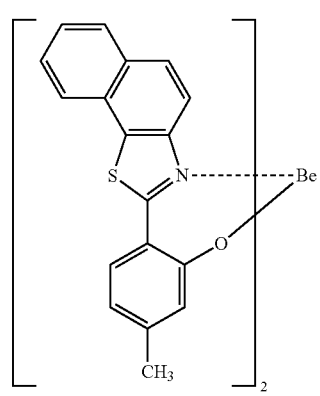

Example 8

An organic light emitting device including a red emission layer was fabricated according to the same method as Example 1, except for using a compound represented by the following Chemical Formula 21 as a host material.

CHEMICAL FORMULA 21

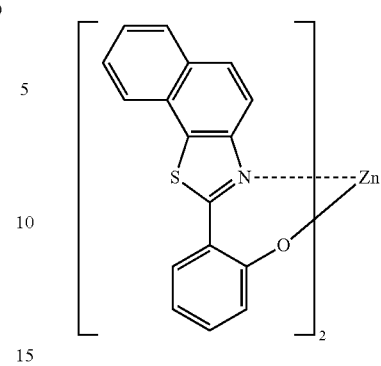

Example 9

An organic light emitting device including a red emission layer was fabricated according to the same method as Example 1, except for using a compound represented by the following Chemical Formula 21 as a host material.

CHEMICAL FORMULA 22

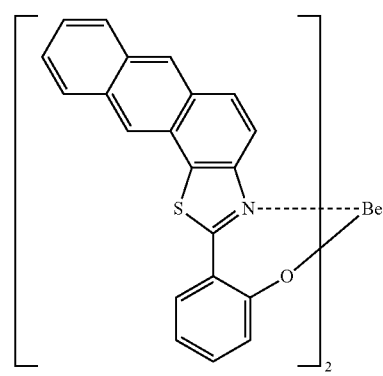

Comparative Example 1

An organic light emitting device including a red emission layer was fabricated according to the same method as Example 1, except for using biphenoxy-bis(8-hydroxy-3-methylquinoline)aluminum (BAlq) represented by the following Chemical Formula 16 as a host material.

Evaluation 1

The organic light emitting devices according to Examples 1 to 9 and Comparative Example 1 were measured regarding driving voltage (V) and current efficiency. The results are provided in the following Table 1.

TABLE 1

| | Driving voltage (V) | Current efficiency (cd/A) | CIE x | CIE y | Maximum light emitting wavelength (nm) |
|---|---|---|---|---|---|
| Example 1 | 3.9 | 36 | 0.658 | 0.342 | 624 |
| Example 2 | 4.1 | 32 | 0.660 | 0.340 | 625 |

TABLE 1-continued

| | Driving voltage (V) | Current efficiency (cd/A) | CIE x | CIE y | Maximum light emitting wavelength (nm) |
|---|---|---|---|---|---|
| Example 3 | 4.2 | 31 | 0.661 | 0.339 | 625 |
| Example 4 | 4.0 | 33 | 0.659 | 0.341 | 624 |
| Example 5 | 4.0 | 32 | 0.658 | 0.341 | 624 |
| Example 6 | 4.3 | 30 | 0.660 | 0.339 | 625 |
| Example 7 | 3.8 | 37 | 0.656 | 0.343 | 623 |
| Example 8 | 4.0 | 35 | 0.659 | 0.340 | 624 |
| Example 9 | 4.5 | 29 | 0.660 | 0.341 | 625 |
| Comparative Example 1 | 5.6 | 19 | 0.661 | 0.338 | 625 |

Referring to Table 1, the organic light emitting devices according to Examples 1 to 9 had a lower driving voltage than the one of Comparative Example 1. In addition, the organic light emitting devices according to Examples 1 to 9 had higher current efficiency than the one of Comparative Example 1.

Furthermore, referring to color quality evaluation through color coordinate and maximum light emitting wavelength measurements, the organic light emitting devices of Examples 1 to 9 had substantially equal color quality to the one of Comparative Example 1.

The organic light emitting devices according to Examples 1 to 9 turned out to emit light with substantially equal color quality at a low driving voltage with high current efficiency compared with the one of Comparative Example 1.

Organic Light Emitting Device Fabrication 2

An Organic Light Emitting Device Including a Green Emission Layer

Example 10

A lower electrode glass was fabricated by disposing a Ag/ITO layer on a substrate and patterning it. Next, N4,N4'-diphenyl-N4,N4'-bis(9-phenyl-9H-carbazol-3-yl)biphenyl-4,4'-diamine and dipyrazino2,3-f:2',3'-hquinoxaline hexacarbonitrile (HAT-CN) were laminated to be respectively about 70 and 5 nm thick to form a hole injection layer (HIL) on the lower electrode. Then, N,N'-di(1-naphtyl)-N,N'-diphenyl-1,1'-biphenyl-4,4'-diamine (NPD) was laminated to be 100 nm thick thereon as a hole transport layer (HTL).

Then, an organic emission layer was disposed thereon by depositing a mixture of a compound represented by the following Chemical Formula 15 and bis(2-phenylpyridine)iridium (ppy). The ppy was mixed in a concentration ratio of 3 wt % with the compound represented by Chemical Formula 15. The compound represented by the above Chemical Formula 15 was used as a host material for forming the organic emission layer, and the ppy was used as a dopant for forming the organic emission layer.

CHEMICAL FORMULA 15

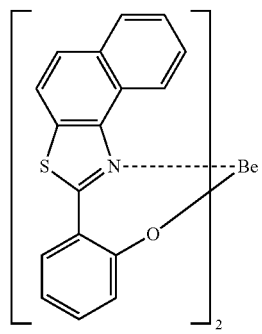

On the organic emission layer, 2-(4-(9,10-di(naphthalen-2-yl)anthracen-2-yl)phenyl)-1-phenyl-1H-benzodimidazole (ETL1) and 8-hydroxyquinolinolato lithium (Liq) were deposited to be respectively about 30 and 0.5 nm thick, forming an electron transport layer (ETL) and an electron injection layer (EIL).

Then, a Mg/Ag layer (a weight ratio of Mg:Ag=160:10) was deposited to be 200 nm thick, fabricating an upper electrode.

In this way, an organic light emitting device including a green emission layer was fabricated.

Comparative Example 2

An organic light emitting device including a green emission layer was fabricated according to the same method as Example 10, except for using 4,4'-N,N'-dicarbazole-biphenyl (CBP) as a host material.

Evaluation 2

The organic light emitting devices of Example 10 and Comparative Example 2 were measured regarding driving voltage (V) and current efficiency. The results are provided in the following Table 2.

TABLE 2

| | Driving voltage (V) | Current efficiency (cd/A) | CIE x | CIE y | Maximum light emitting wavelength (nm) |
|---|---|---|---|---|---|
| Example 10 | 5.1 | 34 | 0.342 | 0.601 | 521 |
| Comparative Example 2 | 6.1 | 33 | 0.327 | 0.611 | 517 |

Referring to Table 2, the organic light emitting device of Example 10 had a lower driving voltage than the one of Comparative Example 2. Furthermore, the organic light emitting device of Example 10 had higher current efficiency than the one of Comparative Example 2.

In addition, referring to color quality evaluation through color coordinate and maximum light emitting wavelength measurements, the organic light emitting devices of Example 10 and Comparative Example 2 had substantially equal color quality.

In other words, the organic light emitting device of Example 10 emitted light with substantially equal color quality to the one of Comparative Example 2 at a low driving voltage with high current efficiency.

While the present embodiments has been described in connection with what is presently considered to be practical example embodiments, it is to be understood that the present embodiments are not limited to the disclosed embodiments, but, on the contrary, is intended to cover various modifications and equivalent arrangements included within the spirit and scope of the appended claims.

What is claimed is:

1. An organic material comprising a compound represented by the following Chemical Formula 14, 18 or 25:

CHEMICAL FORMULA 14

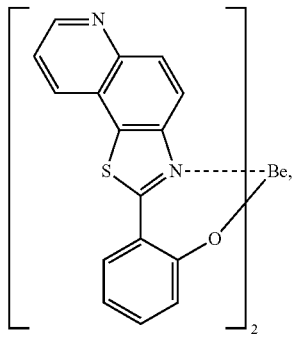

CHEMICAL FORMULA 18

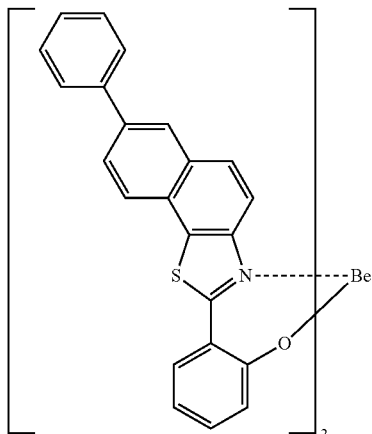

CHEMICAL FORMULA 25

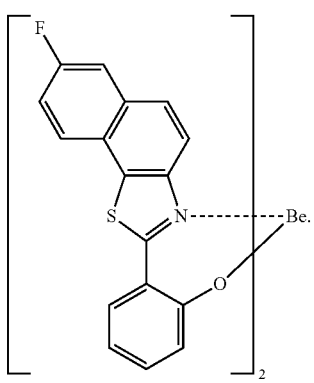

2. The organic material of claim 1, wherein the compound represented by the above Chemical Formula 1 comprises at least one of the compounds of the following Chemical Formulae 18 and 25:

CHEMICAL FORMULA 18

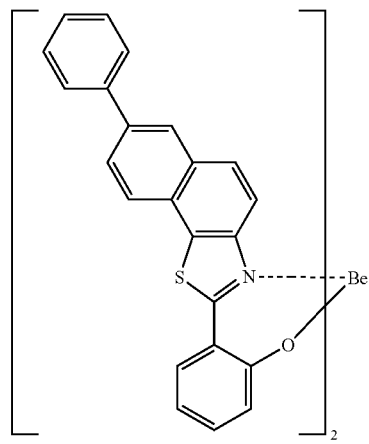

CHEMICAL FORMULA 25

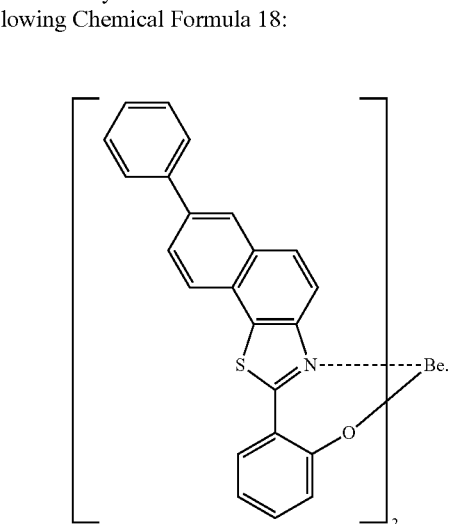

3. The organic material of claim 1, wherein the compound represented by the above Chemical Formula 1 comprises the following Chemical Formula 18:

4. An organic light emitting device comprising:
a first electrode and a second electrode facing each other; and
an organic layer interposed between the first electrode and the second electrode, wherein the organic layer comprises the compound represented by the following Chemical Formula 14, 18 or 25:

CHEMICAL FORMULA 14

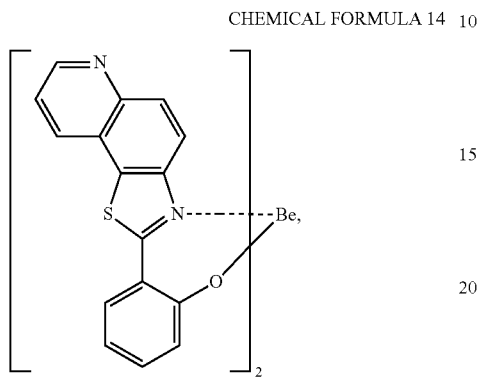

5. The organic light emitting device of claim 4, wherein the organic light emitting device comprises at least one of the compounds of the following Chemical Formulae 18 and 25:

CHEMICAL FORMULA 18

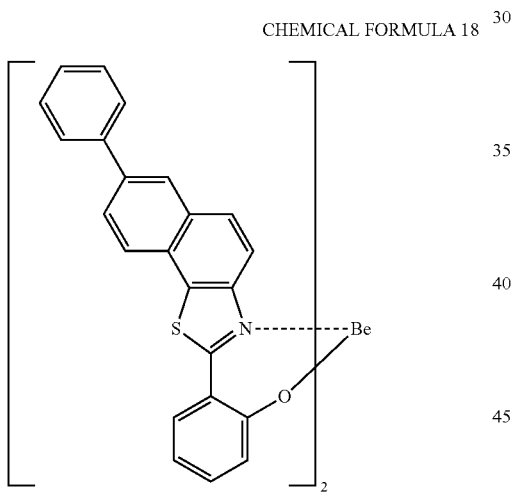

CHEMICAL FORMULA 25

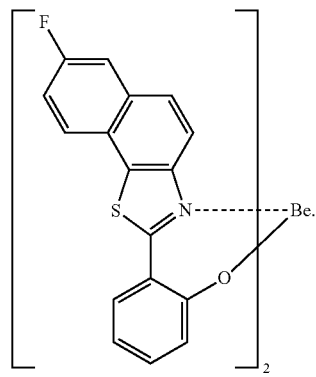

6. The organic light emitting device of claim 4, wherein the compound represented by the above Chemical Formula 1 comprises the following Chemical Formula 18:

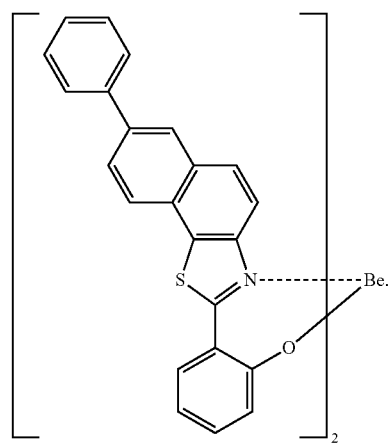

7. The organic light emitting device of claim 4, wherein the organic layer is an organic emission layer and the compound of Chemical Formula 14, 18 or 25 is a host material.

8. The organic light emitting device of claim 7, wherein the organic emission layer further comprises a dopant material.

* * * * *

UNITED STATES PATENT AND TRADEMARK OFFICE
CERTIFICATE OF CORRECTION

PATENT NO.      : 8,512,881 B2
APPLICATION NO. : 12/912628
DATED           : August 20, 2013
INVENTOR(S)     : Hamada et al.

It is certified that error appears in the above-identified patent and that said Letters Patent is hereby corrected as shown below:

In the Specification

At Column 17, Lines 59-60, Change "acetylanetonate" to --acetylacetonate--.

At Column 18, Line 35, Change "hquinoxaline" to --quinoxaline--.

In the Claims

At Column 27, Lines 10-25, Change " 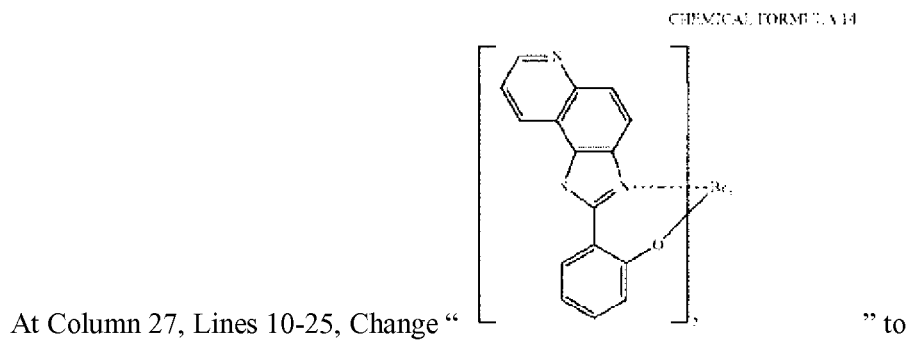 " to

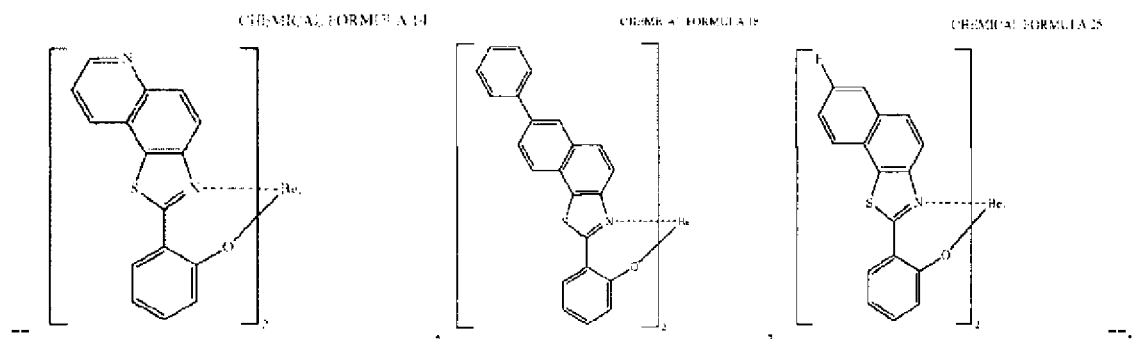 --.

Signed and Sealed this
Thirteenth Day of May, 2014

Michelle K. Lee
*Deputy Director of the United States Patent and Trademark Office*